(12) United States Patent
Sichanugrist et al.

(10) Patent No.: US 7,671,271 B2
(45) Date of Patent: Mar. 2, 2010

(54) THIN FILM SOLAR CELL AND ITS FABRICATION PROCESS

(75) Inventors: Porponth Sichanugrist, Klong Luang (TH); Nirut Pingate, Klong Luang (TH); Decha Yotsaksri, Klong Luang (TH)

(73) Assignee: National Science and Technology Dev. Agency, Prathumthani (TH)

( * ) Notice: Subject to any disclaimer, the term of this patent is extended or adjusted under 35 U.S.C. 154(b) by 469 days.

(21) Appl. No.: 11/481,035

(22) Filed: Jul. 5, 2006

(65) Prior Publication Data

US 2007/0209699 A1    Sep. 13, 2007

(30) Foreign Application Priority Data

Mar. 8, 2006    (TH) ............................. 0601001008

(51) Int. Cl.
*H01L 31/00* (2006.01)
(52) U.S. Cl. .................... 136/258; 136/255; 136/261
(58) Field of Classification Search ................ 136/258, 136/255, 261
See application file for complete search history.

(56) References Cited

U.S. PATENT DOCUMENTS

| | | | | |
|---|---|---|---|---|
| 5,507,881 A | | 4/1996 | Sichanugrist et al. | |
| 5,853,498 A | * | 12/1998 | Beneking et al. | 136/258 |
| 5,913,986 A | * | 6/1999 | Matsuyama | 136/258 |
| 2004/0221887 A1 | * | 11/2004 | Kondo et al. | 136/255 |

FOREIGN PATENT DOCUMENTS

| | | |
|---|---|---|
| EP | 0 631 327 A1 | 12/1994 |
| JP | 5175528 | 7/1993 |

* cited by examiner

*Primary Examiner*—Basia Ridley
*Assistant Examiner*—Thanh-Truc Trinh
(74) *Attorney, Agent, or Firm*—Baker & Daniels LLP

(57) ABSTRACT

A method for producing a solar cell including the steps of forming a p-type microcrystalline silicon oxide layer on a glass substrate using a PECVD method and raw gases comprising Silane gas, Diborane gas, Hydrogen gas and Carbon Dioxide gas. The method may employ a frequency of between about 13.56-60 MHz. The PECVD method may be performed at a power density of between about 10-40 $mW/cm^2$ and a pressure of between about 0.5-2 Torr, and with a ratio of Carbon Dioxide to Silane of between about 0.10-0.24; a ratio of Diborane to Silane of 0.10 or less, and a ratio of Silane to Hydrogen of 0.01 or less. A tandem solar cell structure may be formed by forming top and bottom layers by the method described above, and placing the top layer over the bottom layer.

9 Claims, 3 Drawing Sheets

THIN FILM SOLAR CELL AND ITS FABRICATION PROCESS

PRIORITY CLAIM

This application claims priority under 35 U.S.C. § 119 to, Thailand Patent Application No. 0601001008, entitled THIN FILM SOLAR CELL AND ITS FABRICATION PROCESS and filed on Mar. 8, 2006.

BACKGROUND

The present invention relates to solar cells and, more particularly, to thin film solar cells and methods for making the same.

Thin film solar cells are relatively inexpensive to produce and, thus, are widely utilized. Due to its low production cost, the energy efficiency of thin film solar cells can be continuously developed and improved. One objective in developing cell efficiency involves making a p-type window layer electrically conductive, while providing the film with low resistivity, good light transmission in every wavelength and low light absorption coefficient. At present, the most widely used thin film is p-type amorphous silicon carbide(p-type a-SiC) fabricated using a plasma enhanced chemical vapor deposition (PECVD) process, which uses Silane gas ($SiH_4$), Diborane gas ($B_2H_6$), Methane gas ($CH_4$) and/or Hydrogen gas ($H_2$).

Cell efficiency may be improved by developing a thin film solar cell having a lower electrical resistance. Low electrical resistance of the film, leads to low resistance of solar cell and better electrical conductivity from the solar cell to the substrate materials. In addition, the thin film solar cell should include a good window layer having a low light absorption coefficient. In the past, p-type microcrystalline silicon carbide thin film was produced, utilizing an electron cyclotron resonance-chemical vapor deposition (ECR-CVD) process using high electromagnetic frequency of 2.4 GHz. By this method, p-type amorphous silicon carbide thin film has also been formed. The resulting thin film has a good window layer. However, in the production of films having a large area, this process may result in poor uniformity of the p-type layer. Accordingly, production of effective and efficient large scale solar cells for commercial use may be difficult.

The problem of forming p-type amorphous silicon carbide thin film over a large area has led to the development and proposal of producing p-type microcrystalline silicon oxide (p-type µc-SiO) thin film through PECVD method using a radio frequency of 13.56 MHz. See U.S. Pat. No. 5,507,881 to Sichanugrist et al. Later, amorphous silicon thin film solar cell was applied on substrate materials, such as stainless steel. Despite these developments, p-type microcrystalline silicon oxide thin film may be formed on certain substrate materials of large size, such as stainless steel, but have not yet been formed on glass substrate. Up to now, p-type amorphous silicon oxide thin film has been used in the production of solar cell on glass substrate.

Accordingly, a need remains for a p-type microcrystalline silicon oxide thin film solar cell on glass having a high efficiency and low production cost.

SUMMARY

The present invention provides a thin film solar cell and methods for making such a solar cell. In one form, the solar cell includes an amorphous silicon thin film solar cell formed on glass substrate and a p-type micro-crystalline silicon oxide layer. In another form, the solar cell includes, in sequence, an amorphous silicon thin film top cell including a Zinc Oxide coated glass substrate, a microcrystalline silicon thin layer, a p-type microcrystalline silicon oxide layer, a buffer layer, an i-type amorphous silicon layer, a microcrystalline silicon layer, a n-type microcrystalline silicon oxide layer and an electrode layer.

In yet another form, the solar cell includes an amorphous silicon thin film bottom cell including a Zinc Oxide coated glass, a microcrystalline silicon thin layer, a p-type microcrystalline silicon oxide layer, a buffer layer, an i-type microcrystalline silicon oxide layer, a n-type microcrystalline silicon oxide layer and an electrode layer.

In still another form, the solar cell includes top and bottom amorphous silicon thin film cells arranged in tandem. The top cell includes, in sequence, a Zinc Oxide coated glass, a top microcrystalline silicon thin layer, a top p-type microcrystalline silicon oxide layer, a top buffer layer, a top i-type amorphous silicon layer, a top microcrystalline silicon layer, and a top n-type microcrystalline silicon oxide layer. The bottom cell includes, in sequence, a bottom microcrystalline silicon thin layer, a bottom p-type microcrystalline silicon oxide layer, a bottom buffer layer, a bottom i-type microcrystalline silicon layer, a bottom n-type microcrystalline silicon oxide layer and an electrode layer.

In one form, the method for producing a solar cell includes the steps of forming a p-type microcrystalline silicon oxide layer on a glass substrate using a PECVD method and raw gases comprising Silane gas ($SiH_4$), Diborane gas ($B_2H_6$), Hydrogen gas ($H_2$) and Carbon Dioxide gas ($CO_2$). The method may employ a frequency of between about 13.56 MHz-60 MHz. The PECVD method may be performed at a power density of between about 10 mW/$cm^2$ and 40 mW/$cm^2$ and a pressure of between about 0.5-2 Torr, and with a ratio of Carbon Dioxide gas to Silane gas of between about 0.10-0.24; a ratio of Diborane gas to Silane gas of between about 0.00-0.10, and a ratio of Silane gas to Hydrogen gas of between about 0.00-0.01. A tandem solar cell structure may be formed by forming a bottom layer by the method described above, forming a top layer by the method described above and placing the top layer over the bottom layer.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein.

Figure 1:
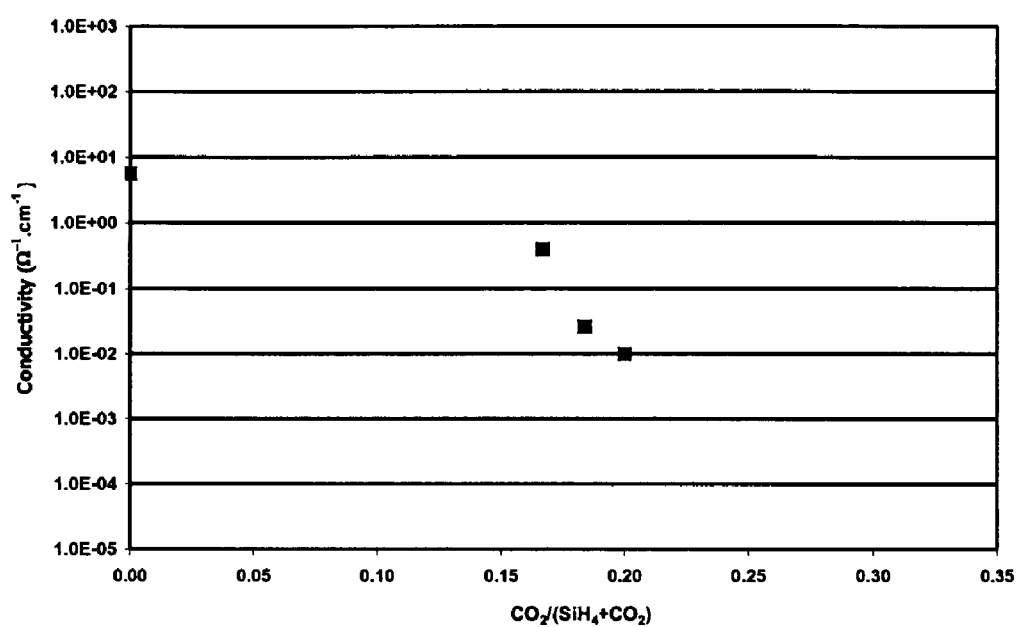
FIG. 1 is a graph illustrating the change of electrical conductivity and the ratio of Carbon Dioxide gas to Silane gas of a p-type microcrystalline silicon oxide thin film made according to one embodiment of the present invention.

Although the drawings represent embodiments of the present invention, the drawings are not necessarily to scale and certain features may be exaggerated in order to better illustrate and explain the present invention. Although the exemplification set out herein illustrates embodiments of the invention, in several forms, the embodiments disclosed below are not intended to be exhaustive or to be construed as limiting the scope of the invention to the precise forms disclosed.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

The present invention provides an improved solar cell and a method for making the solar cell. The solar cell includes a p-type microcrystalline silicon oxide thin film on a glass substrate. To produce the solar cell, the p-type microcrystalline silicon oxide thin film is produced using a plasma enhanced chemical vapor deposition (PECVD) process. More particularly, in one particular embodiment the process involves first obtaining 2 pieces of 10 cm×10 cm glass substrate. It should be noted that the pieces of glass substrate may vary in size. The glass substrate may be any glass suitable for use as a solar cell substrate, including for instance barium borosilicate glass (glass code 7059). The two pieces of glass are then cleaned, such as with alcohol, to remove all dirt and are blown dry. The glass substrate pieces are positioned in the center of a substrate holder and a stainless plate is placed on top of the glass. The substrate holder is then placed in a load lock chamber (LL) and a vacuum is applied to the chamber until the pressure in the load lock chamber remains approximately $1 \times 10^{-3}$ Torr. The chamber and the glass substrate therein are heated until temperature reaches approximately 150° C.-190° C. The heat is then switched off the heater and the substrate holder with the glass substrate is removed from the load lock chamber.

Next, the substrate holder with glass substrate is placed into a p-layer producing chamber having a temperature of between about 150° C.-190° C. The glass substrate is placed parallel to the electrode. A vacuum is applied to the p-layer chamber until the p-layer chamber remains approximately $1 \times 10^{-6}$ Torr.

Raw gases, including Silane gas, Hydrogen gas, Diborane gas and Carbon Dioxide gas are introduced to the p-layer chamber. The Silane gas, Hydrogen gas and Diborane gas are introduced at a constant rate, while the rate of Carbon Dioxide gas is altered from 0.10-0.90 sccm. Further details regarding the conditions for forming the p-type microcrystalline silicon oxide film are found in Table 1.

When the substrate temperature reaches between 150° C.-190° C. and the pressure in the p-layer chamber is between about 0.5-2.0 Torr, high frequency electromagnetic and power density is distributed, as indicated in Table 1, into the electrode to dissociate the raw gases, resulting in a p-type microcrystalline silicon oxide thin film on the glass substrate. The frequency and density may be applied until the film reaches the desired thickness. The high frequency electromagnetic generator and gases are turned off and a vacuum is applied to the p-layer producing chamber to remove remaining gas. The resulting p-layer substrate is removed from the p-layer chamber.

The p-layer substrate is then placed in the load lock chamber and Nitrogen gas is introduced in the chamber to adjust the chamber pressure to atmosphere pressure. The p-layer substrate is then removed. The resulting p-layer glass substrate may then be measured for light transmission, electrical conductivity and uniformity.

TABLE 1

| Conditions in forming p-type microcrystalline silicon oxide thin film | |
|---|---|
| Substrate type | Corning 7059 |
| Frequency | 13.56-60 MHz |
| Substrate temperature | 150° C.-190° C. |
| Pressure | 0.5-2 Torr |
| Power density | 10-40 mW/cm$^2$ |
| (SiH$_4$)/(SiH$_4$ + H$_2$)) | 0.00-0.01 |
| (CO$_2$/(CO$_2$ + SiH$_4$)) | 0.10-0.24 |
| (B$_2$H$_6$/(B$_2$H$_6$ + SiH$_4$)) | 0.00-0.94 |

The resulting transparent p-type microcrystalline silicon oxide thin film may be used in forming top and bottom cells of the solar cells, as described in further detail below. The resulting top and bottom cells may be placed in tandem to form the solar cell.

Figure 2:
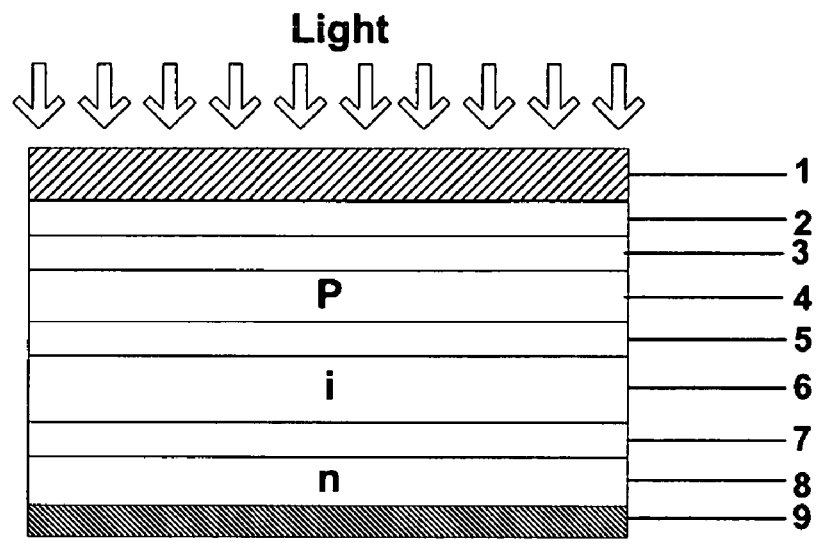
FIG. 2 is sectional view of a top cell structure of amorphous silicon thin film solar cell applying p-type microcrystalline silicon oxide in accordance with an embodiment of the present invention.

The top cell structure is an amorphous silicon thin film solar cell formed using p-type microcrystalline silicon oxide. As shown in FIG. 2, the structure of the top cell of amorphous silicon thin film solar cell applying p-type microcrystalline silicon oxide is composed of transparent electrode glass 1, Zinc Oxide layer 2, microcrystalline silicon layer 3, p-type microcrystalline silicon oxide layer 4, buffer layer 5, i-type amorphous silicon layer 6, microcrystalline silicon layer 7, n-type microcrystalline silicon oxide layer 8, and electrode layer 9.

Formation of the top cell structure involves obtaining two pieces of substrate glass sized at 10 cm×10 cm each. The glass pieces are cleaned with alcohol to remove all dirt and are blown dry. The glass plates are loaded in the center of a substrate holder and a stainless plate is placed on the top of the glass. The substrate holder is then loaded into load lock chamber (LL) and a vacuum is applied to the chamber until pressure in the load lock chamber remains approximately $1 \times 10^{-3}$ Torr. The glass is then heated until the temperature reaches approximately 150° C.-190° C.

The substrate holder is removed from the load lock chamber and placed into a Zinc Oxide chamber (ZnO), which is placed under a vacuum and heated until the pressure is approximately $1 \times 10^{-6}$ Torr and the temperature is approximately 150° C.-250° C. Argon gas is introduced into the chamber at a rate of between about 6-10 sccm. A direct current supplier is activated to distribute power to the Zinc Oxide plate, and the glass substrate plates are coated by a sputtering method until the film reaches the desired thickness. The gas and energy generators are switched off and the substrate holder with coated glass substrate is removed from the Zinc Oxide chamber.

The resulting coated glass substrate and holder are then placed in a p-layer chamber and microcrystalline silicon thin film (μc-Si), p-type microcrystalline silicon oxide thin film (p (μc-SiO)) and buffer layer are formed as described above through a continuous process. A temperature of between about 150° C.-190° C. The glass substrate is placed parallel to the electrode. A vacuum is applied to the p-layer chamber until the p-layer chamber remains approximately $1 \times 10^{-6}$ Torr. Raw gases, including Silane gas, Hydrogen gas, Diborane gas and Carbon Dioxide gas are introduced to the p-layer chamber. The Silane gas, Hydrogen gas and Diborane gas are introduced at a constant rate, while the rate of Carbon Dioxide gas is altered from 0.10-0.9 sccm. Further details regarding the conditions for forming the p-type microcrystalline silicon oxide film are found in Table 1. When the substrate temperature reaches between 150° C.-190° C. and the pressure in the p-layer chamber is between approximately 0.5-2 Torr, high frequency electromagnetic and power density is distributed, as indicated in Table 1, into the electrode to dissociate the raw gases, resulting in a p-type microcrystalline silicon oxide thin film on the glass substrate. The frequency and density may be applied until the film reaches the desired thickness. The substrate holder with the layer substrate is removed from the p-type layer chamber.

Next, an i-type amorphous silicon thin film (i(a-Si)) ("i-layer") is formed by placing the substrate holder with the layer substrate into an i-layer chamber and a vacuum is applied until the pressure reaches about $1 \times 10^{-6}$ Torr. The i-layer chamber is heated until the temperature is approximately 150° C.-190° C. Silane gas ($SiH_4$) and Hydrogen gas ($H_2$) are introduced into the i-layer chamber. The ratio of Silane gas to Hydrogen gas is approximately 0.40-1.00. Once the i-layer chamber pressure reaches between about 0.5-2 Torr, the high frequency electromagnetic generator is activated to distribute high frequency electromagnetic into the electrode at a frequency of higher than 13.56 MHz and power density of about 10 mW/cm² –40 mW/cm² to thereby dissociate raw gases. When the film reaches the desired thickness, the gases and power generators are switched off and the remaining gases are removed from the chamber. The substrate holder with layer glass substrate is removed from the i-layer chamber.

The substrate holder with layer glass substrate is then placed in a n-layer chamber to form microcrystalline silicon thin film and n-type microcrystalline silicon oxide thin film through continuous process. Internal pressure of the chamber is adjusted to about $1 \times 10^{-6}$ Torr and heated to a temperature of between about 150° C.-190° C. Silane gas, Phosphine gas ($PH_3$) and Hydrogen gas are introduced into the chamber at a ratio of Silane gas to Hydrogen gas of approximately 0.04-0.10 and a ratio of Phosphine gas to Hydrogen gas of about 0.10-0.50. Then the internal pressure of n-layer chamber reaches 0.5-2 Torr, the high frequency electromagnetic generator is turned on to distribute high frequency electromagnetic having a frequency of higher than 13.56 MHz and a power density of 10-40 mW/cm² into the electrode to dissociate raw gases. When the film becomes as thick as desired, the gas and high frequency electromagnetic are switched off and the remaining gas is removed. The substrate holder with glass substrate is removed from the n-layer chamber.

The substrate holder with layer glass substrate is then placed into an electrode chamber in which heat and vacuum are applied to a pressure of about 1 x 10-6 Torr and a temperature of between approximately 150° C.-250° C. Argon gas is introduced at a flow rate of between about 6-10 sccm. A direct current supplier is activated and distributes power to electrode to thereby coat the glass substrate by a sputtering method. When the film has reached the desired thickness, the gas and power distributors are switched off and the substrate holder with layer glass substrate is removed from the electrode chamber.

The substrate holder with layer glass substrate is then placed into the load lock chamber and Nitrogen gas is introduced into the chamber until the internal pressure reaches atmosphere pressure and the substrate holder with layer glass substrate is removed. The resulting top layer cell structure may then be measured for light transmission, electrical conductivity and film constancy.

Figure 3:
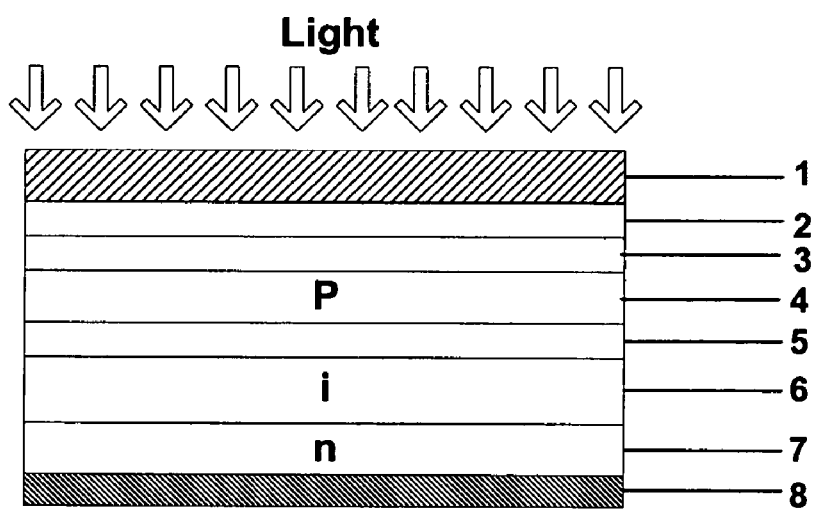
FIG. 3 is a sectional view of a bottom cell structure of amorphous silicon thin film solar cell applying p-type microcrystalline silicon oxide in accordance with an embodiment of the present invention.

A structure of a bottom cell of amorphous silicon thin film applying p-type microcrystalline silicon oxide according to the present invention is illustrated in FIG. 3 and includes, in sequence, transparent electrode glass 1, Zinc Oxide layer 2, microcrystalline silicon layer 3, p-type microcrystalline silicon oxide layer 4, buffer layer 5, i-type microcrystalline silicon layer 6, n-type microcrystalline silicon oxide layer 7 and electrode layer 8.

The fabrication of the amorphous silicon thin film solar cell applying p-type microcrystalline silicon oxide in the bottom cell structure shown in FIG. 3 will now be described. First, solar cells are formed as described above from the process of preparing substrate to forming buffer layer.

Next, the substrate holder with layer glass substrate is placed into an i-layer chamber to form an i-type microcrystalline silicon film (i(μc-Si)). The chamber is placed under vacuum to reach a pressure of $1 \times 10^{-6}$ Torr and temperature of between 150° C.-190° C. Silane gas and Hydrogen gas are introduced into the chamber at a ratio of between 0.10-0.50. When the internal pressure becomes about 0.5-2 Torr, high frequency electromagnetic of higher than 13.56 MHz and a power density about 10-40 mW/cm² is applied to the electrode to dissociate raw gases. When the film reaches the desired thickness, the gas and power distributors are switched off and the remaining gas is removed. The substrate holder with layer glass substrate is removed from the i-layer chamber.

The substrate holder with layer glass substrate is placed into a n-layer chamber to form n-type microcrystalline silicon oxide thin film (n(μc-SiO)). The n-layer chamber brought to a pressure of about $10 \times 10^{-6}$ Torr and a temperature of 150° C. -190° C. Silane gas ($SiH_4$), Phosphine gas ($PH_3$) and Hydrogen gas ($H_2$) is introduced into the chamber at a ratio of Silane gas to Hydrogen gas of approximately 0.04-0.10 and a ratio of Phosphine gas to Hydrogen gas of about 0.10-0.50. The internal pressure of the n-layer chamber is brought to between about 0.50-2 Torr. A high frequency electromagnetic higher than 13.56 MHz and a power density of 10-40 mW/cm² is applied to the electromagnetic plate to dissociate raw gases. When the film reaches the desired thickness, gas and power are turned off and the remaining gas is removed. The substrate holder with layer glass substrate is removed from the n-layer chamber and placed into an electrode chamber.

The electrode is formed by following the production process described above with respect to the top cell. The resulting substrate holder with layer glass substrate is removed from the electrode chamber and placed into the load lock chamber. Nitrogen gas is introduced into the load lock chamber and the pressure is adjusted to atmosphere pressure. The substrate holder with layer glass substrate is then removed from the load lock chamber and the glass may be measured for light transmission, electrical conductivity and film uniformity.

Figure 4:
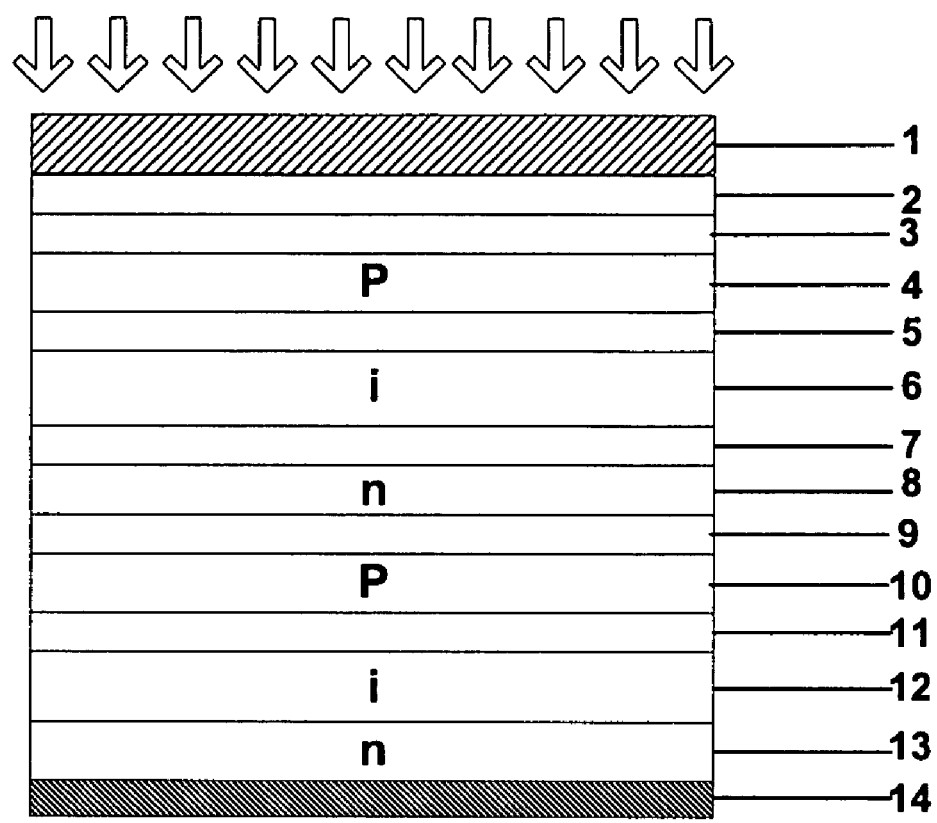
FIG. 4 is a sectional view of a tandem structure of amorphous silicon thin film solar cell applying p-type microcrystalline silicon oxide in accordance with an embodiment of the present invention.

The top and bottom cells described above and produced according to the methods described above may be used to form a tandem structure by overlapping top and bottom cells. An exemplary tandem structure is illustrated in FIG. 4 and includes transparent electrode glass 1, Zinc Oxide layer 2, microcrystalline silicon layer 3, p-type microcrystalline silicon oxide layer 4, buffer layer 5, i-type microcrystalline silicon layer 6, microcrystalline silicon layer 7, n-type microcrystalline silicon oxide layer 8, microcrystalline silicon layer 9, p-type microcrystalline silicon oxide layer 10, buffer layer 11, i-type microcrystalline silicon layer 12, n-type microcrystalline silicon oxide layer 13, and electrode layer 14.

Coating ZnO on the glass and making a microcrystalline silicon thin layer on ZnO creates a microcrystalline silicon oxide having a lattice constant of ZnO structure, similar to silicon, thereby achieving good uniformity across the layer. Further, forming the microcrystalline silicon prior to window layer results in the window layer being formed next to be microcrystalline silicon oxide from the very beginning. This is because in forming microcrystalline silicon film, film will be well formed in thick film layer but this will, on the contrary, be a problem in forming microcrystalline silicon thin film. Forming microcrystalline silicon prior to window layer consequently solves those problems occurred in forming microcrystalline silicon oxide thin film. In addition, using high frequency electromagnetic, i.e. 13.56-60.00 MHz, more effectively forms a microcrystalline silicon oxide thin film over a large area and, thus, is suitable for commercial purpose.

The electrical characteristics of the solar cells produced through the above-mentioned process was measured and compared to a conventional amorphous silicon thin film solar cell.

The electrical characteristics of p-type microcrystalline silicon oxide top cell (as shown in FIG. 2) is better than the conventional p-type amorphous silicon oxide cell. The measuring results of top cell are shown in Table 2 below.

TABLE 2

Comparison of electrical characteristics between p-type microcrystalline silicon oxide top cell and the conventional p-type amorphous silicon oxide cell.

| Type of solar cell | Voc (V) | Jsc (mA/cm$^2$) | FF | Eff (%) |
|---|---|---|---|---|
| Microcrystalline silicon oxide top cell | 0.90 | 17.8 | 0.69 | 11.0 |
| Conventional amorphous silicon oxide top cell | 0.92 | 17.5 | 0.64 | 10.2 |

As illustrated in Table 2, the p-type microcrystalline silicon oxide solar cell has better electrical characteristics than the conventional p-type amorphous silicon oxide solar cell.

The p-type microcrystalline silicon oxide bottom cell of the present invention (as shown in FIG. 3) also has a better electrical characteristics than the conventional p-type microcrystalline silicon. The measuring results of the bottom cell are shown in Table 3 below.

TABLE 3

Comparison of electrical characteristics between p-type microcrystalline silicon oxide bottom cell and the conventional p-type microcrystalline silicon cell.

| Type of solar cell | Voc (V) | Jsc (mA/cm$^2$) | FF | Eff (%) |
|---|---|---|---|---|
| P-type microcrystalline silicon oxide bottom cell | 0.52 | 24.4 | 0.66 | 8.25 |
| Conventional p-type microcrystalline bottom cell | 0.48 | 25.1 | 0.61 | 7.24 |

Moreover, it is found that in joining top and bottom cells together having a tandem structure, as shown in FIG. 4, the highest efficiency of tandem solar cell using p-type microcrystalline silicon oxide in top and bottom cells on glass is more than 14%. This high efficiency indicates the potentiality of p-type microcrystalline silicon oxide.

In making the layer to be microcrystalline silicon with good electrical conductivity and low light absorption coefficient, PECVD method was applied, using high frequency electromagnetic higher than radio frequency over 13.56 MHz. Besides, as the thinness of the said layer is less than 20 nanometers, volume of microcrystalline is small, thus resulting to low efficiency of solar cells. To solve this problem, solar cell is therefore produced on Zinc Oxide substrate with lattice constant, similar to silicon and microcrystalline silicon thin film.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A solar cell comprising:
    a glass substrate; and
    a silicon thin film top cell including, in sequence,
    a zinc oxide coating on the glass substrate,
    a microcrystalline silicon thin layer,
    a p-type microcrystalline silicon oxide layer,
    a buffer layer,
    an i-type amorphous silicon layer,
    a second microcrystalline silicon layer,
    a n-type microcrystalline silicon oxide layer and an electrode layer.

2. A solar cell as in claim 1, wherein said p-type microcrystalline silicone oxide layer is at most 20 nanometers thick.

3. A solar cell as in claim 1, wherein said silicon thin film top cell is more efficient than a p-type amorphous silicon oxide cell.

4. A solar cell comprising:
    a silicon thin film bottom cell including, in sequence,
    a zinc oxide coated glass,
    a microcrystalline silicon thin layer,
    a p-type microcrystalline silicon oxide layer,
    a buffer layer,
    an i-type microcrystalline silicon layer,
    a n-type microcrystalline silicon oxide layer and
    an electrode layer.

5. A solar cell as in claim 4, wherein said p-type microcrystalline silicon oxide layer is at most 20 nanometers thick.

6. A solar cell as in claim 4, wherein said silicon thin film top cell is more efficient than a p-type amorphous silicon oxide cell.

7. A solar cell comprising:
    top and bottom silicon thin film cells arranged in tandem,
        said top silicon thin film cell including in sequence
        a zinc oxide coated glass,
        a top microcrystalline silicon thin layer,
        a top p-type microcrystalline silicon oxide layer,
        a top buffer layer,
        a top i-type amorphous silicon layer,
        a second top microcrystalline silicon layer, and
        a top n-type microcrystalline silicon oxide layer;
    and said bottom silicon thin film cell including in sequence
        a bottom microcrystalline silicon thin layer,
        a bottom p-type microcrystalline silicon oxide layer,
        a bottom buffer layer,
        a bottom i-type microcrystalline silicon layer,
        a bottom n-type microcrystalline silicon oxide layer and
        an electrode layer.

8. A solar cell as in claim 7, wherein at least one of said p-type microcrystalline silicon oxide layer and said bottom p-type microcrystalline silicon oxide layer is at most 20 nanometers thick.

9. A solar cell as in claim 7, wherein said silicon thin film top cell is more efficient than a p-type amorphous silicon oxide cell.

* * * * *